(12) United States Patent
Moganty et al.

(10) Patent No.: US 9,864,012 B2
(45) Date of Patent: Jan. 9, 2018

(54) CHARGE CONTROL AND TERMINATION OF LITHIUM SULFUR CELLS AND FUEL GAUGING SYSTEMS AND METHODS

(71) Applicant: NOHMS Technologies, Inc., Rochester, NY (US)

(72) Inventors: Surya Sekhar Moganty, Henrietta, NY (US); Vladimir Fabre, Rochester, NY (US); Xiaojing Zhu, Rochester, NY (US)

(73) Assignee: NOHMS Technologies, Inc., Rochester, NY (US)

( * ) Notice: Subject to any disclaimer, the term of this patent is extended or adjusted under 35 U.S.C. 154(b) by 224 days.

(21) Appl. No.: 14/625,626

(22) Filed: Feb. 18, 2015

(65) Prior Publication Data

US 2015/0234014 A1    Aug. 20, 2015

Related U.S. Application Data

(60) Provisional application No. 61/942,340, filed on Feb. 20, 2014.

(51) Int. Cl.
| | |
|---|---|
| *H02J 7/00* | (2006.01) |
| *H02J 7/14* | (2006.01) |
| *G01R 31/36* | (2006.01) |
| *H01M 10/44* | (2006.01) |
| *H01M 10/48* | (2006.01) |
| *H01M 4/58* | (2010.01) |
| *H01M 10/052* | (2010.01) |

(52) U.S. Cl.
CPC ..... *G01R 31/3606* (2013.01); *G01R 31/3665* (2013.01); *H01M 10/448* (2013.01); *H01M 10/48* (2013.01); *G01R 31/3651* (2013.01); *G01R 31/3662* (2013.01); *H01M 4/5815* (2013.01); *H01M 10/052* (2013.01)

(58) Field of Classification Search
USPC ....... 320/120, 132, 134, 136, 116, 162, 117, 320/130, 135, 149; 324/426, 430, 433
See application file for complete search history.

(56) References Cited

U.S. PATENT DOCUMENTS

| | | | | |
|---|---|---|---|---|
| 2005/0271941 | A1* | 12/2005 | Bushong | H01M 2/1686 429/218.1 |
| 2009/0286163 | A1* | 11/2009 | Shin | H01M 4/5815 429/315 |
| 2011/0248682 | A1* | 10/2011 | Issaev | H01M 4/382 320/135 |
| 2012/0082890 | A1* | 4/2012 | Dong | H01M 6/164 429/188 |
| 2012/0306452 | A1* | 12/2012 | Christensen | H01M 10/441 320/136 |

(Continued)

*Primary Examiner* — Alexis Pacheco
(74) *Attorney, Agent, or Firm* — Bond, Schoeneck & King, PLLC; Joseph Noto

(57) ABSTRACT

This invention pertains to determining the proper discharge level of lithium sulfur, as well as to determine the state of charge and remaining capacity of battery cells. In particular, this invention provides for a method for determining the charge and/or discharge level of a lithium sulfur cell. Also, this invention provides for a method for determining the capacity of a battery cell charge and/or discharge level of lithium sulfur cell. Further, this invention provides a method for determining the impedance of a lithium sulfur battery cell.

19 Claims, 3 Drawing Sheets

(56) References Cited

U.S. PATENT DOCUMENTS

2013/0295469 A1* 11/2013 Liang .................... H01M 4/134
429/335
2013/0323542 A1* 12/2013 Wijayawardhana .... H01M 4/00
429/50

* cited by examiner

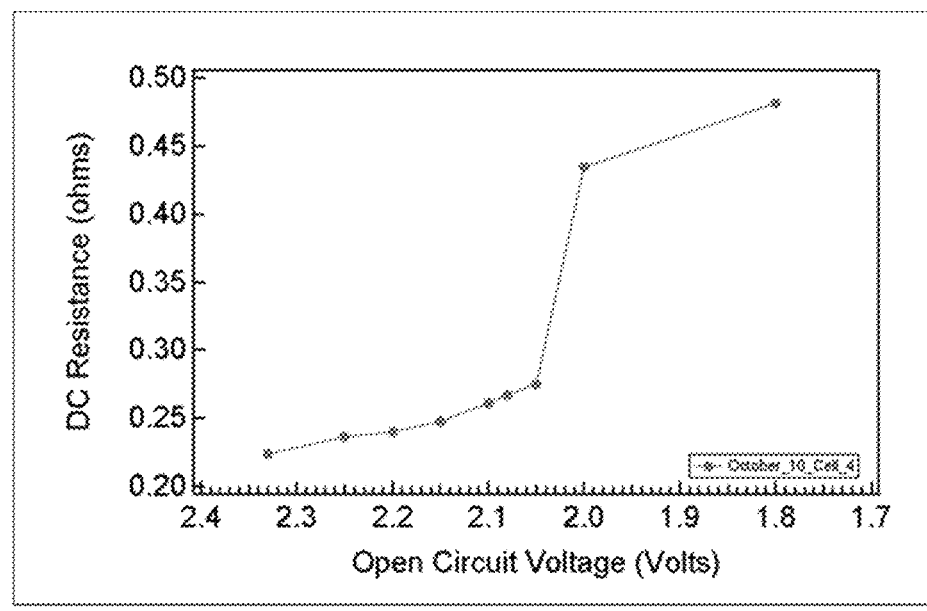
Figure 3 – Evolution of DCIR with State of Charge of the battery
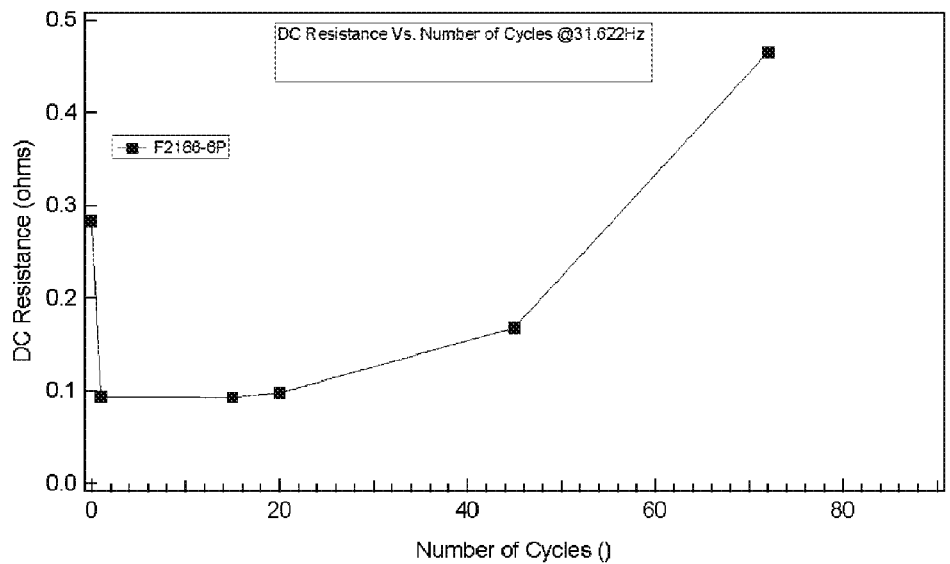
Figure 4 – Evolution of DCIR with Cycling

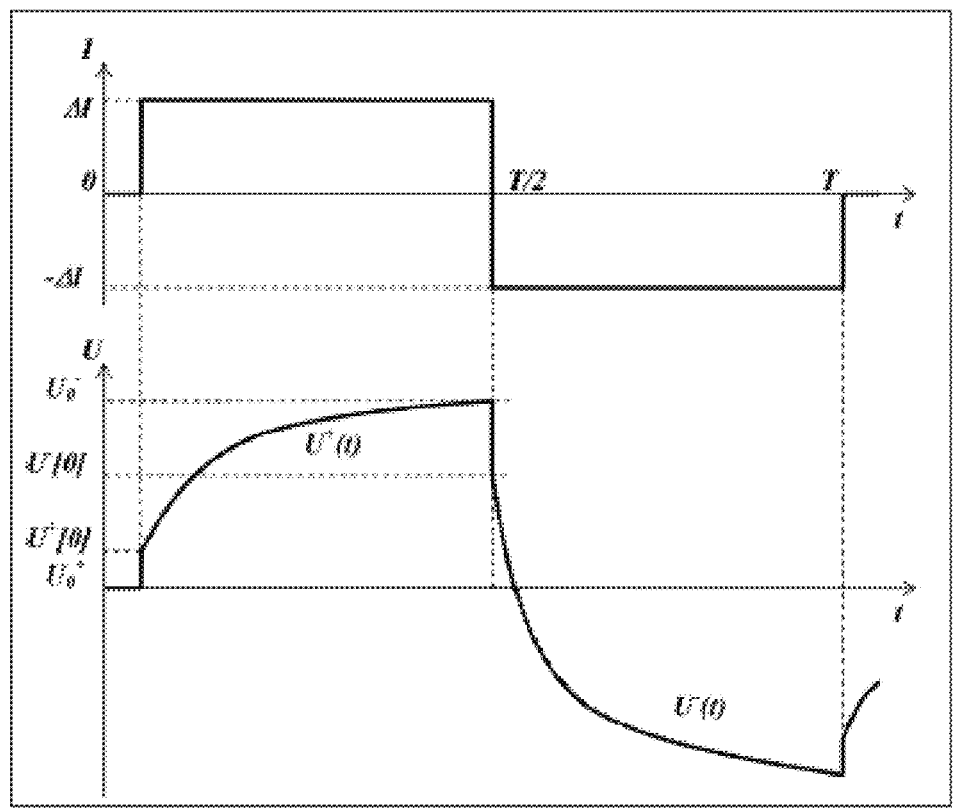
Figure 5 – I(t) – Applied Current Pulse, U(t) - Voltage response signal

CHARGE CONTROL AND TERMINATION OF LITHIUM SULFUR CELLS AND FUEL GAUGING SYSTEMS AND METHODS

TECHNICAL FIELD

The present invention generally relates to the field of electrochemical cells. More particularly, this invention pertains to determining the proper discharge level of lithium sulfur, as well as to determine the state of charge and remaining capacity of battery cells.

BACKGROUND

The disclosures of the publications, patents, and published patent specifications referenced in this application are hereby incorporated by reference into the present disclosure to more fully describe the state of the art to which this invention pertains.

The need for rechargeable batteries with long cycle life, rapid charge capacity, and high energy density for devices such as mobile telephones, portable computers and other consumer electronic devices continues to grow. Rechargeable batteries, such as those based on lithium metal anodes and solid electroactive sulfur-containing cathode active materials, provide one approach to meet this need. For example, U.S. Pat. Nos. 5,529,860, 5,601,947, and 5,690,702 to Skotheim et al., and U.S. Pat. No. 6,201,100 to Gorkovenko et al., describe electroactive sulfur-containing cathode active materials and lithium/sulfur batteries using these sulfur-containing cathode active materials.

However, one problem encountered in electrochemical cells based on lithium and sulfur-containing cathode active materials is limited cycle life, i.e., the number of recharging that the battery can accept before the battery is no longer able to maintain acceptable levels of charge capacity, such as 50-80% of the initial capacity of the battery.

It has been shown that the charge conditions may directly affect the lithium surface morphology in recharging lithium secondary cells with lithium metal anodes and with transition metal oxide cathodes. It is believed that lithium surface morphology created in the lithium deposition process is one important factor in determining cycle life. For example, Aurbach et al., in J. Electrochem. Soc., 1988, 145, 1421-1426, report a much lower cycle life for Li—Li$_x$MnO$_2$ cells, with lithium metal anodes under fast charge rates (1.25 mA/cm$^2$) compared with slow charge rates (0.3 mA/cm$^2$).

It has also been shown that discharge rates may affect the cycle life of rechargeable batteries. For example, it has been reported that high discharge rates for lithium cells result in longer cycle life than low discharge rates. For example, Saito et al. report, in J. Power Sources, 1998, 72, 111-117, that for LiNV$_2$O$_5$—P$_2$O$_5$ cells, low rate discharging (0.5 mA/cm$^2$ results in a higher surface area for a lithium metal anode and in much lower cycle life than high rate discharging (5.0 mA/cm$^2$).

Lithium sulfur battery continues to suffer from several problems that have hindered its broad commercialization. One of the obstacles is the solubility of the lithium polysulfides (PS) (Li$_2$Sx, 2<x<8) generated during the charge/discharge processes. These higher order PS derived from the reduction of elemental sulfur are highly soluble in organic electrolytes and can be fully reduced at the lithium metal anode. PS can also accumulate at the surface of the carbon cathode and be further reduced to lower order PS, such as Li$_2$S$_2$ or Li$_2$S. The insulating nature of these lower order PS blocks the electron pathway on the cathode. This is detrimental for the long-term operation of the battery. Also, by the end of complete discharge elemental sulfur converts to Li$_2$S. Over a repeated charge-discharge cycles, dissolution and deposition of PS over the surface of cathode results in morphological changes. Gradually, due to the morphological changes, sulfur losses contact with the cathode and become inactive. Hence, to enhance the cycle life of the lithium sulfur battery, it is important to minimize the formation of Li$_2$S.

There is a need in rechargeable lithium metal batteries for both long cycle life and rapid charge times, and for charging methods that maximize the cycle life while shortening charge times. There is also a need for charging regimes designed for rechargeable batteries comprising sulfur-containing cathodes. The present invention addresses the need for rapid charge times while at the same time achieving long cycle life for rechargeable batteries comprising sulfur-containing cathodes.

It would be an advancement in the art to provide a simple method to determine a remaining capacity of an electrochemical cell. Further, it would be an advancement in the art to correlate a state of charge profile with a reference in conjunction with a degradation model to terminate a charging process.

SUMMARY OF THE INVENTION

One aspect of this invention relates to a method for determining the charge and/or discharge level of a lithium sulfur cell which comprises: a) conducting a discharge profile at different voltages during discharge to produce a graphical discharge profile for determining the capacity of the cell during discharge; b) correlating the change in graphical discharge profile to the formation of low order polysulfides from a high order polysulfides; and c) discharging the level of lithium sulfur cell to a voltage (or corresponding capacitance based on the change in graphical structure) prior to the formation of low order polysulfides.

Another aspect of this invention relates to a method for determining the capacity of a battery cell charge and/or discharge level of lithium sulfur cell which comprises a) conducting a discharge profile at different voltages during discharge to produce a graphical discharge profile, the discharge profile having a plurality of graphical discharge plateaus; b) measuring a first graphical discharge plateau using a DV/DT slope as a first reference point; c) measuring a subsequent graphical discharge plateau using a DV/DT slope a subsequent reference point; d) determining a capacity ratio between the first graphical discharge plateau and the subsequent discharge plateau; and e) calculating the capacity of the battery cell based on the capacity ratio of step d).

Another aspect of this invention relates to a method for determining the impedance of a lithium sulfur battery cell which comprises a) conducting a discharge profile at different voltages during discharge to produce a graphical discharge profile, the discharge profile having a plurality of graphical discharge plateaus; b) measuring a first graphical discharge plateau using a DV/DT slope as a first reference point; c) measuring a subsequent graphical discharge plateau using a DV/DT slope a subsequent reference point; d) determining a capacity ratio between the first graphical discharge plateau and the subsequent discharge plateau; e)

calculating the capacity value of the battery cell based on the capacity ratio of step d); and f) incorporating the capacity value of step e) into a look up table for use with an algorithm to produce a charging algorithm.

In an embodiment, the graphical discharge profile is based on electrochemical impedance spectroscopy.

In another embodiment, the high order polysulfides comprises sulfur containing materials with a high concentration of sulfur.

In one embodiment, the high order polysulfides comprises S8.

In another embodiment, the low order pulysulfides comprises sulfur containing materials with a high concentration of lithium.

In an embodiment, the low order polysulfides comprises Li2S.

In an embodiment, the graphical discharge profile measures the voltage vs. capacity.

In an embodiment, the graphical discharge profile is a Nyguist plot.

In an embodiment, the graphical discharge profile measures the Zim (imaginary value) and Zre (real value of impedance) as a function of applied frequency at various voltage.

In an embodiment, the graphical discharge profile is a Nyguist plot that uses double current pulses.

In an embodiment, the method for determining the charge and/or discharge level of lithium sulfur cell further includes forming an electronic circuit to implement a DV/DT function based on the graphical discharge profile to estimate the battery discharge with the formation of lower order polysulfides.

These and other features of the invention will be further described and exemplified in the drawings and detailed description below.

BRIEF DESCRIPTION OF THE DRAWINGS

FIG. 3 is a graphical representation of an evolution of DCIR with the state of charge of a battery, wherein the plot shows the DC resistance (in ohms) against open circuit voltage number of cycles for a sample in at 3.162 Hz.

FIG. 4 is a graphical representation of an evolution of DCIR with cycling, wherein the plot shows the DC resistance (in ohms) against the number of cycles for a sample at 31.622 Hz.

FIG. 5 is a graphical representation of an applied current pulse against voltage for a typical battery, where a symmetrical bipolar current of a square wave shape is added to the charge or discharge current pulse having a duration of time period corresponding to 1/frequency at the saddle point.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Figure 1:
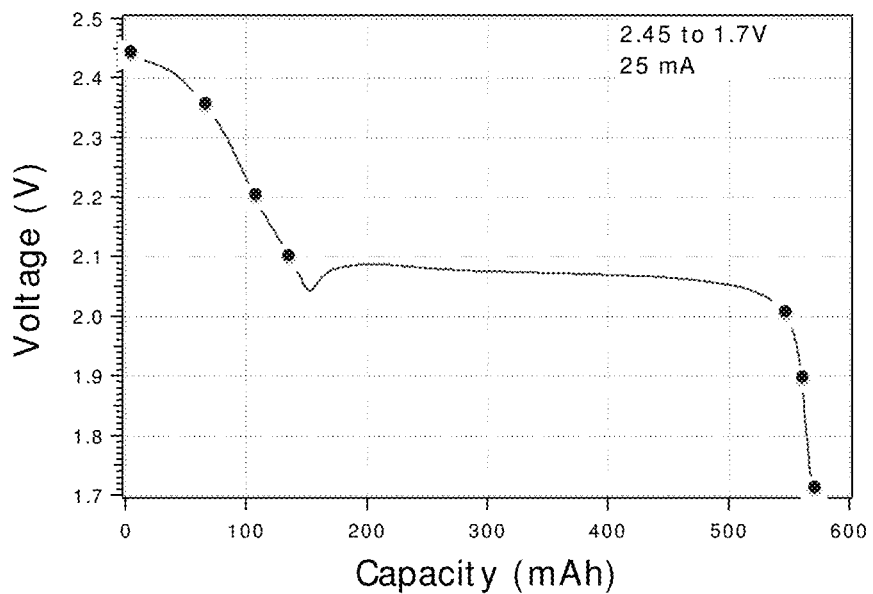
FIG. 1 is a graphical representation of a galvanostatic discharge profile from sulfur to the formation of lithium sulfur using Nyquist plot display.

Since voltage, temperature and resistance change linearly with the state of charge (SOC), continuous monitoring of SOC is difficult. In addition, because of the relatively flat second discharge plateau (as shown in FIG. 1), correlating SOC with Open Cell Voltage (OCV) is difficult, if nearly impossible.

The present invention makes use of Electrochemical Impedance Spectroscopy (EIS) to identify unique electrochemical changes that occur during the charge and discharge process of the lithium sulfur cell. FIG. 1 depicts the Nyquist plots showing impedance spectra as a function of discharge voltage. After 2V, the measured impedance spectra showed a noticeable change in both shape and magnitude. This is related to the formation of solid $Li_2S$ phase. Hence, avoiding the $Li_2S$ formation will prolong the cycle life of the lithium sulfur batteries. The current invention provides for methods to terminate the discharge of the lithium sulfur cell before completely converting active material into $Li_2S$.

Figure 2:
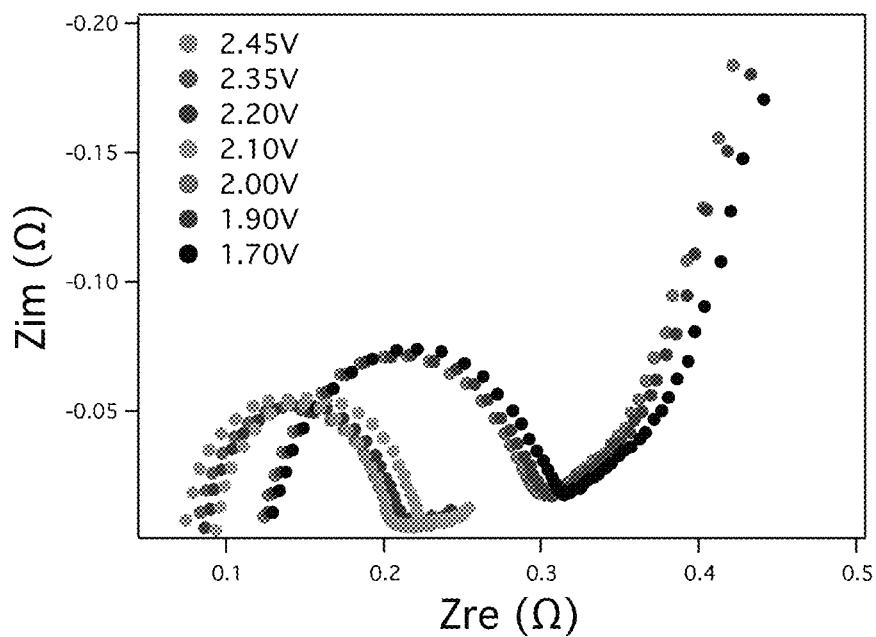
FIG. 2 is a graphical representation of the measurement of impedance of lithium sulfur cell using Nyquist plot display Zim (imaginary value) and Zre (real value of impedance) as a function of applied frequency. Double current pulses were applied at selected voltages.

In FIG. 2, EIS measurements were conducted at the corresponding open circuit potential (OCP) value for the lithium sulfur cells in order to satisfy the conditions required for the validity of the EIS measurements. For any impedance measurement, the system under investigation should follow the stability criterion. In a typical EIS experiment, a small AC voltage perturbation is applied and the corresponding current response is observed. The system under investigation should retain its original state after the applied perturbation during the EIS data collection. Nyquist plot display Zim (imaginary value) and Zre (real value of impedance) as a function of applied frequency. This is a typical way of representing the data with high to low frequency.

In one embodiment, dynamically measuring the impedance of the lithium sulfur cell and terminating the charge/discharge based on impedance response will set charge/discharge control protocols.

In another embodiment, charge/discharge termination protocols is determined by dynamically measuring the impedance of the lithium sulfur cells using double current pulses.

The impedance data is fitted to an electrical equivalent model that is then used to create a degradation model. This degradation model is inputted into an algorithm that determines the proper charge termination while compensating for aging, temperature change, and sulfur utilization.

Furthermore, this invention discloses how an electronic circuit can be used to implement a DV/DT function that estimate when the battery crosses the first discharge plateau into the second discharge plateau to establish a reference point from which other measurements can be made. For instance, the present invention provides for the use of a two-steps charging process for lithium sulfur. The cell is charged with a constant current source until it reaches a capacity associated with the beginning of the second plateau and then a modulated current source is used until the cell reaches the maximum charge voltage and thereby, the beginning of the first discharge plateau. The proper modulation frequency is determined by using the aforementioned EIS technique. This technique is again used to identify the resonant frequency of the battery as a system and ultimately provide the modulated current charging current charging signal at or near the resonant frequency of the battery.

Another aspect of the invention discloses a way to estimate remaining capacity in a few simple steps:
1) Perform a full discharge capacity to establish the cell capacity
2) Measure capacity of the first plateau using the DV/DT slope as a reference point.
3) Depending on materials used in the composition of the cells, determine the capacity ratio between the first and second discharge plateau, then calculate the remaining capacity.

The first plateau capacity can be 15%-40% of the total capacity of the cell based on the material's history.

At least one embodiment of the invention use the same EIS technique to determine the impedance of the cell at 1 kHz. This value provides a linear correlation with SOC for lithium sulfur cell and provides a reference that can be used in conjunction with the degradation model to terminate charging. The data is then used in a look-up table for use by the algorithm.

Another aspect of the invention addresses the problem of capacity degradation over extended cycles, which originates from the dissolution and deposition of PS over the surface of the cathodes. In particular, this invention accurately determines the point to which charging is terminated for efficient charging, enhanced battery life and safety. Unlike cells with electrolyte-insoluble electrode material (for example, lithium ion or nickel metal hydride cells), the chemical composition of the electrolyte and electrodes change during charging and discharging for cells with liquid cathode (for example, lithium sulfur). See FIG. 3. In addition, the impedance of lithium sulfur cell is characterized by a continuous increase of the cell impedance with extended cycling. See FIG. 4. Further, in another aspect of the invention, recharging batteries is extended to an algorithm that can be programmed into fuel gauge/charger integrated circuits.

The impedance diagram of a lithium sulfur cell contains a V-shape curve whose minimum frequency (or saddle point) defines the internal resistance (DCIR) of the cell. This saddle point does not vary with the depth or charge or discharge of the battery or aging. The low frequency at the saddle point provides a good correlation between the impedance at that frequency and the onset of $Li_2S$ formation.

Another embodiment of the invention uses an impedance spectroscopy instruments to generate a small voltage or current excitation signal at the frequency of interest to the battery. Since the response of the battery with respect to the excitation signal is different according to the different value of the battery impedance which represents the state of the battery, the electrochemical impedance measured at the saddle point is used to monitor the state of the battery.

Yet another embodiment of the invention uses an EIS equipment to measure the impedance of a single cell or small module, as in a battery, while the battery is installed in its intended application. Therefore, this invention provides for a simple method for recharging batteries by integration into a battery charger or gas gauge. In another embodiments, this invention provides for a technique that integrates within a chip or a chipset.

Another aspect of the invention uses, at a selected moment, a symmetrical bipolar current of a square wave shape that is added to the charge or discharge current pulse similar to FIG. 5 that has duration of time period corresponding to 1/frequency at the saddle point. The amplitude of the applied current was selected to be a small fraction of the cell capacity. By measuring the voltage response to the excitation pulse, the DCIR can be calculated using equation 1:

$$DCIR = \Delta V / \Delta I \qquad (1)$$

The charging algorithm based on the invention can be programmed into commercially available Fuel Gauge Integrated Circuits such as Texas Instruments "Impedance Track™" technology.

Discharge Limits Termination

Multiple pouch cells were constructed in the following manner: The sulfur cathode consisted of a mixture of elemental sulfur as an active material, carbon black, binder and other conductive materials. The mixed slurry was cast on an aluminum foil, and dried at 70° C. overnight. The anode was made with two pieces of lithium foils of proper dimension that were cut and rolled together with a copper current collector sandwiched between them. A Celgard separator, electrolyte and a laminate pouch were used for cell assembly.

The preliminary cycling test of those pouch cells was conducted in the voltage range of 1.8V to 2.8V vs. Li/Li+ by constant current method using a Neware Battery Analyzing system.

EIS (Electrochemical Impedance Spectroscopy) measurements were carried out at different Depth of Discharge in the frequency range of between 1 MHZ and 10 mHz with a perturbation amplitude of 10 mV using a Princeton Applied Research VersaSTAT™ MC. The companion VersaStudio™ software was used to plot the results as shown in the Nyquist plot of FIG. 2.

The impedance diagram was obtained by discharging a fully charged cell at 25 mA and an EIS measurement was taken at each point highlighted in FIG. 1. The resulting Nyquist plot is shown in FIG. 2, where a minimum frequency of 31.622 Hz was recorded at the local minimum (or saddle point) of the impedance plot. That impedance value was recorded as the DCIR. Note that this frequency can vary based on the composition of the cathode and electrolyte solution but regardless, of the actual number, the DCIR can be obtained at that location.

Furthermore, the Nyquist plot was fitted into an Electrical Equivalent Circuit (EEC) using ZSimpwin and the total fitted resistance was calculated. The results correlated with the DCIR obtained from the Nyquist plot.

Subsequently, a technique similar to FIG. 5 was used to measure the DCIR. The period of the pulse was chosen to be 1/f where f was the frequency at the saddle point. By dividing the change of voltage by the change in current, the DCIR was calculated and it matched the value obtained for both the Nyquist method and the EEC method. This is the value that is monitored to determine when to terminate discharge of the lithium sulfur cell to alleviate or prevent the formation of $Li_2S$.

Fuel Gauging Using Capacity Plateaus

The data of Table 1 below was obtained experimentally from cells similar in composition to the ones used for the charge termination data collection and used to determine the ratio of the two plateaus with regards to C-Rate and the number of cycles. As can be seen by the results, the ratio of the plateaus is very consistent and this fact can be used in conjunction with a Coulomb Counter and a derived algorithm to accurately determine the remaining battery capacity by using the beginning of second plateau from the slope of the first plateau.

TABLE 1

Lithium Sulfur Capacity ratio of the two characteristic plateaus for different C-Rate and Number of Cycling

| Cell Number | Cycle # | Rate | 1st Plateau | 2nd Plateau | Total Capacity | 1st fraction | 2nd fraction | Ratio |
|---|---|---|---|---|---|---|---|---|
| BH1-93-SA1-1P | 2 | 1.00E−01 | 445.5 | 1559 | 1113.5 | 0.286 | 0.714 | 2.499 |
| BH1-93-SA1-1P | 3 | 1.00E−01 | 439.4 | 1568 | 1128.6 | 0.280 | 0.720 | 2.569 |
| BH1-93-SA1-1P | 5 | 1.00E−01 | 402.5 | 1354 | 951.5 | 0.297 | 0.703 | 2.364 |
| BH1-93-SA1-1P | 6 | 2.80E−01 | 394 | 1360 | 966 | 0.290 | 0.710 | 2.452 |
| BH1-93-SA1-1P | 7 | 2.80E−01 | 390.5 | 1350 | 959.5 | 0.289 | 0.711 | 2.457 |
| BH1-93-SA1-1P | 8 | 2.80E−01 | 388.5 | 1341 | 952.5 | 0.290 | 0.710 | 2.452 |
| BH1-93-SA1-1P | 9 | 2.80E−01 | 385.4 | 1345 | 959.6 | 0.287 | 0.713 | 2.490 |
| BH1-93-SA1-1P | 15 | 2.80E−01 | 357 | 1262 | 905 | 0.283 | 0.717 | 2.535 |
| BH1-93-SA1-1P | 20 | 2.80E−01 | 343 | 1209 | 866 | 0.284 | 0.716 | 2.525 |
| BH1-93-SA1-64-3P | 2 | 1.00E−01 | 447.6 | 1558.1 | 1110.5 | 0.287 | 0.713 | 2.481 |
| BH1-93-SA1-64-3P | 3 | 1.00E−01 | 441.1 | 1553 | 1111.9 | 0.284 | 0.716 | 2.521 |
| BH1-93-SA1-64-3P | 5 | 2.80E−01 | 410.9 | 1374.2 | 963.3 | 0.299 | 0.701 | 2.344 |
| BH1-93-SA1-64-3P | 6 | 2.80E−01 | 404.7 | 1385.8 | 981.1 | 0.292 | 0.708 | 2.424 |
| BH1-93-SA1-64-3P | 7 | 2.80E−01 | 393.9 | 1371.2 | 977.3 | 0.287 | 0.713 | 2.481 |
| BH1-93-SA1-64-3P | 8 | 2.80E−01 | 393.1 | 1379.7 | 986.6 | 0.285 | 0.715 | 2.510 |
| BH1-93-SA1-64-3P | 9 | 2.80E−01 | 392 | 1385.5 | 993.5 | 0.283 | 0.717 | 2.534 |
| BH1-93-SA1-64-3P | 15 | 2.80E−01 | 393.9 | 1395.9 | 1002 | 0.282 | 0.718 | 2.544 |
| BH1-93-SA1-64-3P | 20 | 2.80E−01 | 393.5 | 1372.5 | 979 | 0.287 | 0.713 | 2.488 |
| BH1-97-SA1-64-5P | 2 | 1.00E−01 | 483.5 | 1677.6 | 1194.1 | 0.288 | 0.712 | 2.470 |
| BH1-97-SA1-64-5P | 4 | 3.20E−01 | 349.2 | 1385.5 | 1036.3 | 0.252 | 0.748 | 2.968 |
| BH1-97-SA1-64-5P | 5 | 3.20E−01 | 435.9 | 1487.1 | 1051.2 | 0.293 | 0.707 | 2.412 |
| BH1-97-SA1-64-5P | 6 | 3.20E−01 | 430.5 | 1470.4 | 1039.9 | 0.293 | 0.707 | 2.416 |
| BH1-97-SA1-64-5P | 7 | 3.20E−01 | 421.2 | 1461.8 | 1040.6 | 0.288 | 0.712 | 2.471 |
| BH1-97-SA1-64-5P | 8 | 3.20E−01 | 416.3 | 1436.8 | 1020.5 | 0.290 | 0.710 | 2.451 |
| BH1-97-SA1-64-5P | 9 | 3.20E−01 | 415.9 | 1443.1 | 1027.2 | 0.288 | 0.712 | 2.470 |
| BH1-97-SA1-64-5P | 15 | 3.20E−01 | 413.2 | 1432.1 | 1018.9 | 0.289 | 0.711 | 2.466 |
| BH1-97-SA1-64-5P | 20 | 3.20E−01 | 414.5 | 1410.8 | 996.3 | 0.294 | 0.706 | 2.404 |
| BH1-97-SA1-64-6P | 2 | 1.00E−01 | 483.5 | 1677.6 | 1194.1 | 0.288 | 0.712 | 2.470 |
| BH1-97-SA1-64-6P | 4 | 3.20E−01 | 349.2 | 1385.5 | 1036.3 | 0.252 | 0.748 | 2.968 |
| BH1-97-SA1-64-6P | 5 | 3.20E−01 | 435.9 | 1487.1 | 1051.2 | 0.293 | 0.707 | 2.412 |
| BH1-97-SA1-64-6P | 6 | 3.20E−01 | 430.5 | 1470.4 | 1039.9 | 0.293 | 0.707 | 2.416 |
| BH1-97-SA1-64-6P | 7 | 3.20E−01 | 421.2 | 1461.8 | 1040.6 | 0.288 | 0.712 | 2.471 |
| BH1-97-SA1-64-6P | 8 | 3.20E−01 | 416.3 | 1436.8 | 1020.5 | 0.290 | 0.710 | 2.451 |
| BH1-97-SA1-64-6P | 9 | 3.20E−01 | 415.9 | 1443.1 | 1027.2 | 0.288 | 0.712 | 2.470 |
| BH1-97-SA1-64-6P | 15 | 3.20E−01 | 413.2 | 1432.1 | 1018.9 | 0.289 | 0.711 | 2.466 |
| BH1-97-SA1-64-6P | 20 | 3.20E−01 | 414.5 | 1410.8 | 996.3 | 0.294 | 0.706 | 2.404 |

All references, including publications, patent applications, and patents, cited herein are hereby incorporated by reference for all purposes to the same extent as if each reference were individually and specifically indicated to be incorporated by reference and were set forth in its entirety herein.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

The invention claimed is:

1. A method for prolonging the cycle life of a lithium sulfur cell which comprises
    a) determining the capacity of the cell at different voltages during discharge to produce a discharge profile;

b) correlating a change in the discharge profile to the formation of low order polysulfides from high order polysulfides;
c) determining an impedance threshold to the formation of the low order polysulfides;
d) dynamically measuring the impedance during cycling between charging and discharging of the cell; and
e) preventing the impedance of the cell from exceeding the impedance threshold during the cycling by terminating the discharge when the impedance approaches the impedance threshold to prevent the formation of low order polysulfides during the cycling.

2. The method of claim 1 wherein the discharge profile is determined by electrochemical impedance spectroscopy.

3. The method of claim 1 wherein the high order polysulfides comprises sulfur containing materials with a high concentration of sulfur.

4. The method of claim 1 wherein the low order pulysulfides comprises sulfur containing materials with a high concentration of lithium.

5. The method of claim 1 wherein the low order polysulfides comprises $Li_2S$.

6. The method of claim 1 wherein the discharge profile is a Nyguist plot that measures the voltage vs. capacity of the cell.

7. The method of claim 1 wherein the discharge profile measures the Zim (imaginary value) and Zre (real value of impedance) as a function of applied frequency at various voltages.

8. The method of claim 7 wherein the discharge profile is based on a Nyguist plot that uses double current pulses.

9. The method of claim 1 further comprises forming an electronic circuit to implement a DV/DT function based on the discharge profile.

10. The method of claim 1 wherein determining the capacity of the lithium sulfur battery cell comprises
a) conducting the discharge at different voltages to produce the discharge profile, the discharge profile having a plurality of discharge plateaus;
b) measuring a first discharge plateau using a DV/DT slope as a first reference point;
c) measuring a subsequent discharge plateau using a DV/DT slope a subsequent reference point;
d) determining a capacity ratio between the first discharge plateau and the subsequent discharge plateau; and
e) calculating the capacity of the battery cell based on the capacity ratio of step d).

11. The method of claim 10 wherein the discharge profile is determined by electrochemical impedance spectroscopy.

12. The method of claim 10 wherein the discharge profile is based on a Nyguist plot that measures the voltage vs. capacity.

13. The method of claim 1 wherein determining the impedance of the lithium sulfur battery cell comprises
a) conducting the discharge at different voltages to produce the discharge profile, the discharge profile having a plurality of discharge plateaus;
b) measuring a first discharge plateau using a DV/DT slope as a first reference point;
c) measuring a subsequent discharge plateau using a DV/DT slope a subsequent reference point;
d) determining a capacity ratio between the first discharge plateau and the subsequent discharge plateau;
e) calculating the capacity value of the battery cell based on the capacity ratio of step d); and
f) incorporating the capacity value of step e) into a look up table for use with an algorithm to produce a charging algorithm.

14. The method of claim 13 further comprising incorporating the charging algorithm into a fuel gauge integrated circuit.

15. The method of claim 14 wherein the discharge profile is determined by electrochemical impedance spectroscopy.

16. The method of claim 13 wherein the discharge profile is based on a Nyguist plot that measures the voltage vs. capacity.

17. The method of claim 1 wherein the low order polysulfides comprises $Li_2S_2$.

18. The method of claim 1 wherein the high order polysulfides comprises $Li_2S_3$, $Li_2S_4$, $Li_2S_5$, $Li_2S_6$, $Li_2S_7$ or $Li_2S_8$.

19. The method of claim 1 further comprising preventing the impedance from exceeding the impedance threshold by controlling the rate of discharge and charge during cycling.

* * * * *